United States Patent [19]

Asai et al.

[11] Patent Number: 4,924,822
[45] Date of Patent: May 15, 1990

[54] GAS FEED SYSTEM FOR A GAS-FIRED DIESEL ENGINE

[75] Inventors: Koetsu Asai; Hiroshi Nakagawa; Mataji Tateishi, all of Nagasaki, Japan

[73] Assignee: Mitsubishi Jukogyo Kabushiki Kaisha, Tokyo, Japan

[21] Appl. No.: 200,707

[22] Filed: Jun. 1, 1988

[30] Foreign Application Priority Data

Jun. 2, 1987 [JP] Japan .................. 62-138638

[51] Int. Cl.$^5$ ............................................. F02B 3/00
[52] U.S. Cl. ............................. 123/27 GE; 123/557; 123/577; 123/304
[58] Field of Search ............... 123/304, 299, 27 GE, 123/557, 577

[56] References Cited

U.S. PATENT DOCUMENTS

| | | | |
|---|---|---|---|
| 3,406,666 | 10/1968 | Steiger | 123/27 GE |
| 3,443,551 | 5/1969 | Laubach | 123/27 GE |
| 4,572,110 | 2/1986 | Haeflich | 122/7 R |
| 4,700,672 | 10/1987 | Baguena | 123/304 |

FOREIGN PATENT DOCUMENTS 58-112536 7/1983 Japan .
2082084A 3/1982 United Kingdom .
2082085 3/1982 United Kingdom .

OTHER PUBLICATIONS

"Gas Injection Diesel Engine and Its Application to LNG Carrier", Mikihiko Miyake et al., Journal of Marine Engineering, Society in Japan, vol. 19, No. 10, Oct. 1984, pp. 17–28.

"Future LNG Carrier", Nobuyuki Ogawa, M.A.N.-B & W (Japan) Ltd., Mar. 1985, vol. 38, No. 3, pp. 44–52.

Primary Examiner—E. Rollins Cross
Attorney, Agent, or Firm—Wenderoth, Lind & Ponack

[57] ABSTRACT

An improved gas feed system for a gas fired diesel engine is disclosed, in which boil-off gas evaporated from liquefied gas is fed to the diesel engine. The improvements reside in that between the diesel engine and a liquefied gas tank for storing a gaseous fuel is provided a liquefied gas adding apparatus for adding liquefied gas into the boil-off gas, and in the provision of a passageway through which high-pressure gas passes pressurized by a high-pressure compressing apparatus which compresses the boil-off gas or a mixture of the boil-off gas and the liquefied gas and the provision of a passageway through which low-pressure gas passes pressurized by a low-pressure compressing apparatus.

2 Claims, 2 Drawing Sheets

GAS FEED SYSTEM FOR A GAS-FIRED DIESEL ENGINE

BACKGROUND OF THE INVENTION

1. Field of the Invention

The present invention relates to a gas feed system for a diesel engine, and more particularly to a gas feed system for feeding gas to a high-pressure gas injection-diffusion combustion type diesel engine.

2. Description of the Prior Art

With regard to diesel engines making use of gas as a fuel, a low-pressure gas premixing combustion type and a high-pressure gas injection-diffusion combustion type are known, and in the prior art the low-pressure gas premixing combustion type is employed in many cases. This type of diesel engine makes use of a method in which a premixed fuel-air mixture is sucked in during an intake stroke or gas is injected into a cylinder from the initial period to the middle period of a compression stroke. With such a method abnormal combustion is liable to be generated due to a temperature rise caused by adiabatic compression during the compression stroke. Hence, to employ such a method the compression ratio must be made lower than in a diesel engine operated by oil fuel, and accordingly, thermal efficiency and output power are lowered.

Therefore, the developments of high-pressure gas injection-diffusion combustion type diesel engines is being carried forward by various companies at present. FIG. 4 shows one example of this high-pressure gas injection-diffusion combustion type of diesel engine in the prior art. With reference to this figure, gas boiled off from a liquefied natural gas tank 11 is pressurized by a high-pressure compressing apparatus 30, it is cooled down to an ordinary temperature by sea water in a heat-exchanger 40, and then it is fed to a diesel engine 70 through a high-pressure gas feed pipe 41. The high-pressure compressing apparatus 30 consists of a 4-stage reciprocating-type compressing mechanisms 31, 32, 33 and 34, which are driven by an electric motor 35. Between the third stage compressing mechanism 33 and the fourth stage compressing mechanism 34 is provided an intercooler 36 in which pressurized gas is cooled by sea water. It is to be noted that reference numeral 10 designates a liquefied gas tank installation.

However, in the high-pressure gas injection-diffusion combustion type diesel engine, a lot of power is necessary for pressurzing gas to a high pressure. In one trial example in which a liquefied natural gas tank having a capacity of 125,000 m³and, 0.1% of the total amount of liquefied gas therein boils off per one day the calculated, compressor power necessary for pressurizing the total amount of liquefied gas to 250 bars (atms.) is about 700 kW.

SUMMARY OF THE INVENTION

It is therefore one object of the present invention to provide a novel gas feed system for a gas-fired diesel engine that is free from the above-described disadvantages in the prior art.

A more specific object of the present invention is to provide a gas feed system for a gas-fired diesel engine in which a relatively small amount of power is necessary for the pressurization of boil-off gas.

According to one feature of the present invention, there is provided a gas feed system for a gas-fired diesel engine running on gaseous fuel, in which a passageway through which a high-pressure gas passes pressurized by a high-pressure gas compressing apparatus and a passageway through which a low-pressure gas passes pressurized by a low-pressure gas compressing apparatus are respectively provided.

According to another feature of the present invention, there is provided a gas feed system for a gas-fired diesel engine running on a boil-off gas evaporated from a liquefied gas, in which between the engine and a liquefied gas tank for storing a gaseous fuel is provided a liquefied gas adding apparatus for adding liquefied gas into the boil-off gas, and in which a passageway is provided through which high-pressure gas passes pressurized by a high-pressure compressing apparatus which compresses the boil-off gas or a mixture of the boil-off gas and the liquefied gas and another passageway is provided through which low-pressure gas passes pressurized by a low-pressure compressing apparatus.

In other words, the above-described problems in the prior art can be resolved due to the following characteristic features of the invention:

(1) There is provided a passageway through which part of the gas fed to the diesel engine as a fuel is fed under a low-pressure gas premixing method, and there is provided another passageway through which the remainder of the gas is fed under a high-pressure gas injection method. The amount of gas fed as low-pressure gas is limited to a range in which abnormal combustion is not generated during the compression stroke.

(2) Liquefied gas is added to gas and then they are compressed.

According to the present invention, the following advantages can be obtained:

(1) Since the amount of the high-pressure gas to be used is reduced, the amount of power necessary for pressurizing the gas to a high-pressure is relatively small.

(2) The temperature of the boil-off gas at the inlet of the compressing apparatus is relatively low. In addition, the temperature rise of the gas during compression is suppressed, and the amount of power necessary for pressurization is relatively small.

The above-mentioned and other objects, features and advantages of the present invention will become more apparent by referring to the following description of preferred embodiments of the invention taken in conjunction with the accompanying drawings.

DETAILED DESCRIPTION OF THE PREFERRED EMBODIMENTS

Figure 1:
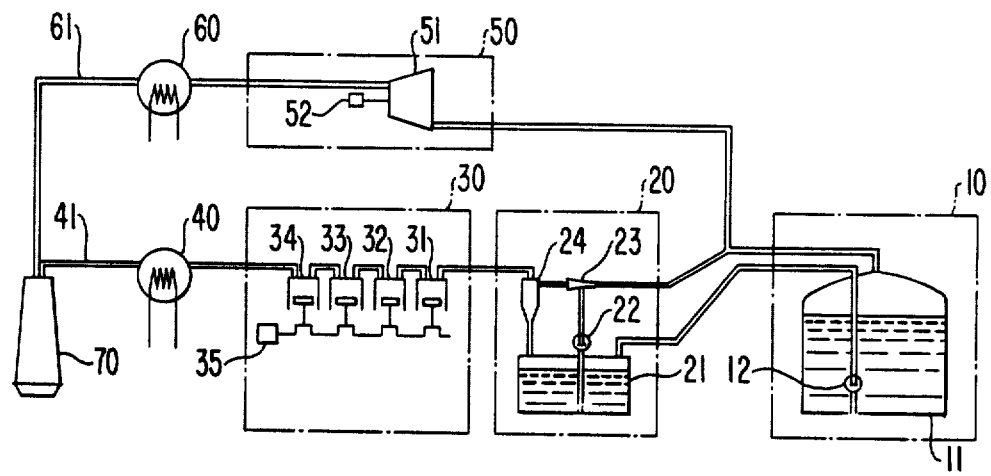
FIG. 1 is a system diagram of a gas feed system according to one preferred embodiment of the present invention.
Figure 2:
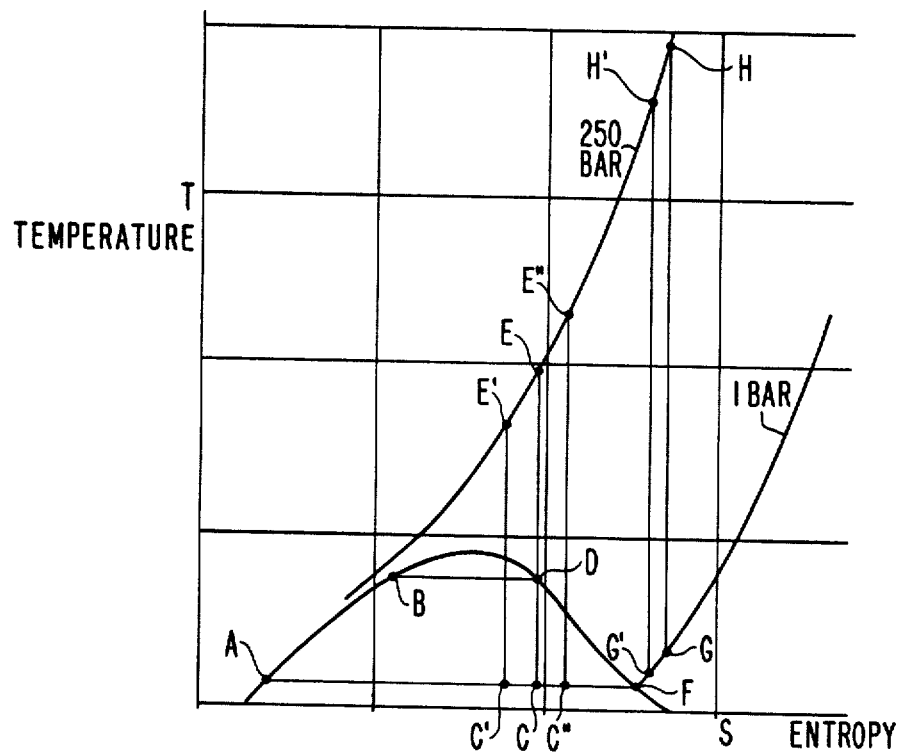
FIG. 2 is a T-S diagram illustrating changes in the state of gas in the system shown in FIG. 1.

In the following, the present invention will be described in greater detail in connection with the preferred embodiments thereof. A first preferred embodiment of the invention is illustrated in FIG. 1, which is a system diagram of a gas feed system in which boil-off gas produced from a liquefied natural gas tank is pressurized and is then fed to a diesel engine. FIG. 2 is a T-S diagram of methane illustrating a change in state of boil-off gas during a compression stroke.

In FIG. 1, reference numeral 10 designates a liquefied natural gas tank installation, numeral 30 designates a liquefied gas adding apparatus, numeral 30 designates a high-pressure compressing apparatus, numeral 40 designates a heat-exchanger, numeral 41 designates a high-pressure gas feed pipe, numeral 50 designates a low-pressure compressing apparatus, numeral 51 designates a low-pressure compressor, numeral 52 designates an electric motor, numeral 60 designates a heat-exchanger, numeral 61 designates a low-pressure gas feed pipe, and numeral 70 designates a diesel engine.

Furthermore, reference numeral 11 designates a natural gas tank, numeral 12 designates a liquefied gas transfer pump, numeral 21 designates a service tank, numeral 22 designates a liquefied gas pressurizing pump, numeral 23 designates a liquefied gas adding nozzle, numeral 24 designates a liquid drop classifier, numerals 31, 32, 33 and 34 designate compressing mechanisms, and numeral 35 designates an electric motor.

The liquefied natural gas within the tank 11 is evaporated by heat of the ambient atmosphere of the tank, and thus a boil-off gas is produced. Most of the boil-off gas is pressurized to a high pressure by the high-pressure compressing apparatus 30, then it is cooled down to an ordinary temperature by sea water in the heat-exchanger 40, and it is fed to the diesel engine 70 through the high-pressure gas feed pipe 41. The high-pressure compressing apparatus 30 includes four stages of reciprocating type compressing mechanisms 31, 32, 33 and 34, which are driven by the electric motor 35. Some of the boil-off gas is pressurized to a low pressure by the low-pressure compressing apparatus 50, then it is heated to an ordinary temperature by sea water in the heat-exchanger 60, and it is fed to the diesel engine 70 through the low-pressure gas feed pipe 61.

In the diesel engine 70 are provided a gas injection nozzle, a control valve and the like (not shown), and the low-pressure gas is either fed to the engine as a pre-mixed fuel-air mixture during the intake stroke of the diesel engine 70 or is injected into the cylinder over the initial period and the middle period of the compression stroke. The amount of low-pressure gas injected at this moment is limited to a range in which abnormal combustion caused by a temperature rise during the adiabatic compression stroke does not take place.

The high-pressure gas is momentarily injected into the cylinder at about of the top dead center position of the piston. Almost simultaneously with this injection of the high-pressure gas, pilot oil for ignition is injected into the cylinder by means of a pilot oil injection device (not shown).

The respective basic technology per se facilitating the low-pressure gas feed, high pressure gas injection and pilot oil injection are well known in connection with of low-pressure gas premixing combustion and high-pressure gas injection-diffusion combustion types of diesel engines.

Referring now to FIG. 2, the ordinate represents a temperature T, and the abscissa represents an entropy S. In this figure, curve A-B represents a saturated liquid line, curve D-F represents a saturated vapor line, curve E-H represents an isobar of 250 bar, and curve A-C-F-G represents an isobar of 1 bar.

In the above-described gas feed system, the liquefied natural gas within the tank 11 is continuously evaporated by heat from the ambient atmosphere, and a boil-off gas is generated. Prior to pressurization in the high-pressure compressing apparatus 30, the boil-off gas is supplemented with liquefied gas by the liquefied gas adding apparatus 20.

More particularly, the service tank 21 in the above-described liquefied gas adding apparatus 20 receives the liquefied gas transferred from the tank 11 by means of the liquefied gas transfer pump 12. The liquefied gas within the service tank 21 is pressurized by the liquefied gas pressurizing pump 22, and it is injected and added to the boil-off gas in a liquefied gas adding nozzle 23.

While the added liquefied gas would evaporate entirely if the injection rate of the liquefied gas were small, if the liquefied gas is injected and added at a higher rate than that necessary for the temperature of the boil-off gas to be lowered to the saturated vapor temperature, the mixture assumes 2-phase flow state consisting of a gas phase of the boil-off gas and a liquid phase of minute drops of the liquefied gas.

Preferably, in the liquid phase the liquid drops should be as minute as possible, and to that end, coarse liquid drops are removed by the liquid drop classifier 24 and returned to the service tank 21. The 2-phase flow having the coarse liquid drops removed therefrom is successively pressurized in four stages by the compressing apparatus 30. Thereafter, it is cooled or heated by sea water in the heat exchanger 40, and then it is fed to the diesel engine 70 as fuel.

For the purpose of explaining the changes in state of the boil-off gas in the respective procedures with reference to the T-S diagram of FIG. 2, the conditions are as follows: That is, the changes in state occur under the given condition that the component of the liquefied natural gas is pure methane. Further, the temperature of the boil-off gas is 130° K., its pressure is 1 bar, and a pressurized gas having a pressure of 250 bar at the ordinary temperature (about 300° K.) is obtained. In addition, it is assumed that the compression is isentropic adiabatic compression, the boil-off gas and the liquid drops of the injected liquefied gas form an ideally uniform mixed phase, and furthermore, thermal invasion from the ambient atmosphere and mechanical friction or the like are negligible.

The state of the boil-off gas before treatment is represented by point G. If the boil-off gas at this state is pressurized to 250 bar by simply compressing it in 4 stages, the gas assumes a state state represented by point H. By cooling the gas down to an ordinary temperature (about 300° K.) by sea water while maintaining the same at a constant pressure of 250 bar, the gas assumes the state represented by point E, and is fed to the diesel engine at this state.

The enthalpy difference between G-H is about 170 kcal/kg, and the enthalpy difference between H-E is about 130 kcal/kg. This means that mechanical energy equivalent to about 170 kcal is consumed per 1 kg of boil-off gas and most of the energy, about 130 kgal, is wasted as thermal energy in the sea water.

Explaining now the treatment according to the present invention, liquefied gas in the state represented by point A is added to boil-off gas at point G. If the amount of the liquefied gas being added is small, it would evaporate entirely, and the temperature of the boil-off gas would be lowered principally by the latent heat of this evaporation and would assume a state between G-F such as that represented by point G'. If this fuel is subjected to 4-stage compression, it would assume a state represented by point H'. The enthalpy difference between G'-H' is smaller than the enthalpy difference between G-H.

As the amount of liquefied gas being injected and added is increased, the temperature of the gas after addition is lowered until it reaches that at point F. If the amount added is further increased, the temperature of the gas after addition would not be lowered under the temperature at point F, but the gas would become a two-phase fluid consisting of gas at point F and liquefied gas at point A.

By way of example, referring now to the case where 0.5 kg of liquefied gas at point A is added to 1 kg of the boil-off gas at point G, the fluid forming the two-phase flow after injection will assume the state represented by point C, and if this fluid is compressed in four stages up to 250 bar, it assumes the state represented by point E, the temperature at point E being about 300° K. Within the compression process from point C to point E, the process from point C to point D is compression of fuel in a two-phase flow. Now explaining the gas phase and liquid phase separately in FIG. 2, the gas phase component is pressurized along the saturated vapor line F-D while, on the other hand, the liquid phase component is pressurized and has its temperature raised along the saturated liquid line A-B while it is partly evaporating. And, upon the total evaporation of the liquid phase, the liquid phase component disappears at point B. The enthalpy difference between C-E is about 85 kcal/kg.

In other words, by adding 0.5 kg of the liquefied gas at point A to 1 kg of the boil-off gas at point G, 1.5 kg of two-phase fluid at point C can be obtained. The mechanical energy necessary for compressing this two-phase fluid to 1.5 kg of the pressurized gas at point E, is equivalent to 85 kcal/kg×1.5 kg≈130 kcal. As described above, when compared to the case in which the boil-off gas at point G is itself compressed, the necessary mechanical energy is reduced, and moreover, the amount of the gas obtained at point E is increased 1.5 times.

If the amount of liquefied gas added to 1 kg of the boil-off gas is more than 0.5 kg, the state assumed by the two-phase liquid shifts from point C towards point A, for instance, to the state represented by point C'. On the contrary, if it is less than 0.5 kg, the state is close to that represented by point C". If the gases at these states are compressed to 250 bar, then they would assume the states represented by point E' and at point E", respectively. Hence, the temperature of the high-pressure gas obtained would vary, and also the mechanical energy necessary for pressurization would decrease or increase, respectively.

If this attained temperature were to exceed the allowable range at which it could be fed to the diesel engine 70, then the attained gas could be heated or cooled by sea water in the heat-exchanger.

It is to be noted that if the proportion of the liquefied gas to be added to the boil-off gas is preset to fall within a certain limited range, that is, if the gas temperature at the outlet of the compressing apparatus 30 is regulated within an allowable range, the heat-exchanger 40 can be omitted.

Figure 3:
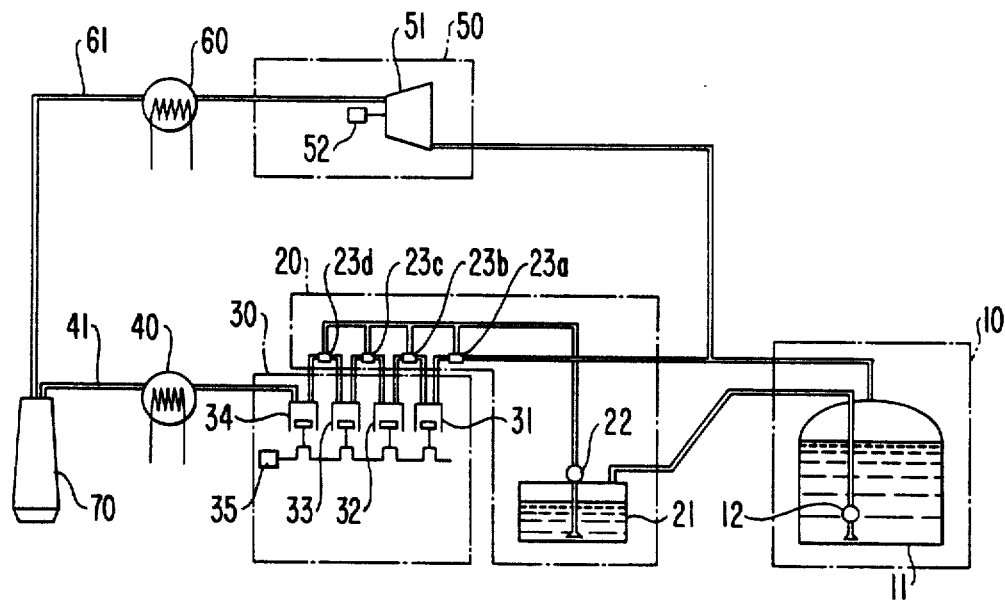
FIG. 3 is a system diagram of a gas feed system according to another preferred embodiment of the present invention.
Figure 4:
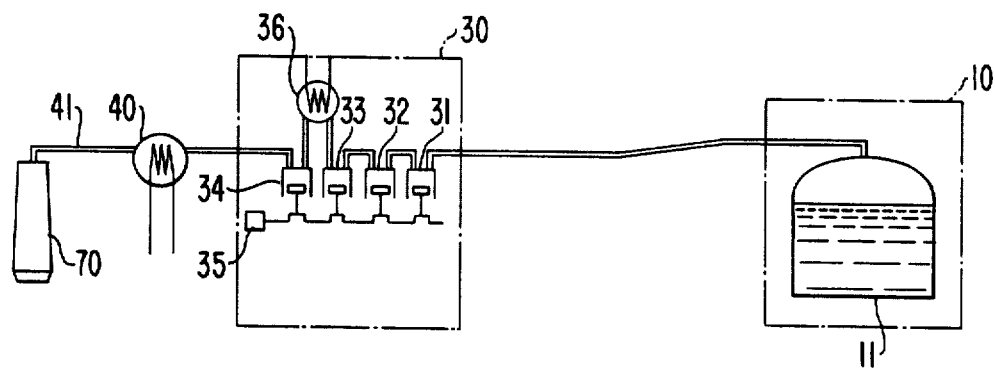
FIG. 4 is a system diagram of a gas feed system in the prior art.

FIG. 3 is a system diagram showing a second preferred embodiment of the present invention.

While in the previous embodiment the total amount of the liquefied gas to be added was added in the stage preceding the high-pressure pressurizing apparatus, in the second preferred embodiment, liquefied gas adding nozzles 22a, 23b, 23c and 23d are respectively associated with the 4 stages of compressing mechanisms 31, 32, 33 and 34 in the high-pressure compressing apparatus 30 to successively add the liquefied gas.

When compressing a two-phase fluid, it is desirable that the liquid-phase component be distributed as uniformly as possible within the gas in a minute liquid drop state. To that end it is necessary to add appropriate amounts of liquefied gas in sequence rather than adding a large amount of liquefied gas at one time. In the second preferred embodiment, since the liquefied gas adding nozzles 23a, 23b, 23c and 23d are provided respectively for corresponding ones of the compressing mechanisms 31, 32, 33 and 34, this requirement can be fulfilled relatively easily.

As described in detail above, according to the present invention, with respect to the feeding of gas to a high-pressure gas injection-diffusion combustion type diesel engine, the characteristic feature exists in that (1) some of the gaseous fuel is fed according to the low-pressure premixing method, and in that (2) liquefied gas is added to the gaseous fuel and then the fuel is compressed, and so, as compared to the method in the prior art in which the total amount of gas is fed as a high-pressure gas, the amount of mechanical power necessary for pressurizing the gas is small because part of the gas is fed in a low-pressure gas state due to feature (1) above.

In addition, due to feature (2) above, the state of gas shown by the T-S diagram upon the compression of the gas is shifted to the low-temperature side as compared to the fuel feed system in the prior art in which liquefied gas is not added, and hence, the power necessary for pressurization is reduced. Moreover, due to the features (1) and (2) above, under a condition in which the amounts of the boil-off gas and the liquefied gas to be added are kept constant, not only is the amount of gas to be compressed to a high-pressure reduced, but also the temperature of the gas when it is compressed to a high pressure is shifted to the lower temperature side, and therefore, the power necessary for pressurization is further reduced remarkably.

While the present invention has been described above in connection with preferred embodiments thereof, it is intended that all matter contained in the above description and illustrated in the accompanying drawings shall be interpreted as illustrative and not limitative of the scope of the invention.

What is claimed is:

1. A gas feed system of a gas-fired diesel engine, said system comprising:
 a high-pressure gas compressing apparatus for compressing gas to a high pressure, said high-pressure gas compressing apparatus disposed in a passageway defined in the system between a source of gas and an intake of the diesel engine; and
 a low-pressure gas compressing apparatus for compressing gas to a low pressure that is lower than said high pressure, said low-pressure gas compressing apparatus disposed in a passageway defined in the system between a source of gas and an intake of the diesel engine.

2. A gas feed system of a gas-fired diesel engine, said system comprising:
 a liquefied gas storing means for storing liquefied gas and for generating boil-off gas from the liquefied gas;

a liquefied gas adding means operatively connected in the system to said liquefied gas storing means for adding liquefied gas to the boil-off gas generated in said liquefied gas storing means to produce a mixture of the boil-off gas and the liquefied gas;

a high-pressure gas compressing apparatus for compressing the boil-off gas generated in said liquefied gas storing means or the mixture produced by said liquefied gas adding means to a high pressure, said high-pressure gas compressing apparatus disposed in a passageway defined in the system between said liquefied gas storing means and an intake of the diesel engine; and a low-pressure gas compressing apparatus for compressing gas to a low pressure that is lower than said high pressure, said low-pressure gas compressing apparatus disposed in a passageway defined in the system between said liquefied gas storing means and an intake of the diesel engine.

* * * * *